United States Patent
Su et al.

(10) Patent No.: US 10,588,213 B2
(45) Date of Patent: Mar. 10, 2020

(54) APPARATUS, SYSTEM, AND METHOD FOR PRECISE HEATSINK ALIGNMENT ON CIRCUIT BOARDS

(71) Applicant: Juniper Networks, Inc., Sunnyvale, CA (US)

(72) Inventors: Peng Su, Santa Clara, CA (US); Gautam Ganguly, San Jose, CA (US); Marc D. Hartranft, Scotts Valley, CA (US)

(73) Assignee: Juniper Networks, Inc, Sunnyvale, CA (US)

( * ) Notice: Subject to any disclaimer, the term of this patent is extended or adjusted under 35 U.S.C. 154(b) by 54 days.

(21) Appl. No.: 15/723,098

(22) Filed: Oct. 2, 2017

(65) Prior Publication Data
US 2019/0104607 A1    Apr. 4, 2019

(51) Int. Cl.
*H05K 1/02* (2006.01)
*H05K 1/11* (2006.01)
(Continued)

(52) U.S. Cl.
CPC ............ *H05K 1/0203* (2013.01); *H01L 23/36* (2013.01); *H01L 23/40* (2013.01); *H05K 1/111* (2013.01);
(Continued)

(58) Field of Classification Search
CPC ....... G06F 1/181–182; H05K 7/20218–20381; H05K 7/20409–20418; H05K 7/20009–202; H05K 1/111; H05K 1/18; H05K 3/22; H05K 2201/066; H05K 2201/10159; H05K 2201/10409; H05K 2201/10606; H05K 1/0203; H05K 7/2039; H01L 23/367–3677; H01L 23/473; H01L 23/46–467; H01L 23/40–4006
(Continued)

(56) References Cited

U.S. PATENT DOCUMENTS 5,311,397 A * 5/1994 Harshberger ............ G06F 1/183
361/679.58
5,718,367 A * 2/1998 Covell, II ............ H01L 21/4853
164/98
(Continued)

OTHER PUBLICATIONS

Peng Su et al.; Apparatus, System, and Method for Mitigating Warpage of Circuit Boards During Reflow Processes; U.S. Appl. No. 15/723,105, filed Oct. 2, 2017.
(Continued)

*Primary Examiner* — Binh B Tran
*Assistant Examiner* — Razmeen Gafur
(74) *Attorney, Agent, or Firm* — FisherBroyles, LLP

(57) ABSTRACT

The disclosed apparatus may include (1) at least one alignment pin that (A) is placed proximate to a component on a circuit board and (B) is secured proximate to the component on the circuit board and (2) at least one heatsink that (A) is placed atop the component after completion of a reflow process in which the component is soldered to the circuit board, (B) is aligned by the alignment pin such that the heatsink resides in a specific position atop the component, and (C) absorbs heat dissipated by the component when the component is operational. Various other apparatuses, systems, and methods are also disclosed.

16 Claims, 6 Drawing Sheets

(51) Int. Cl.
*H05K 1/18* (2006.01)
*H05K 3/22* (2006.01)
*H01L 23/40* (2006.01)
*H01L 23/36* (2006.01)

(52) U.S. Cl.
CPC .............. *H05K 1/18* (2013.01); *H05K 3/22* (2013.01); *H05K 2201/066* (2013.01); *H05K 2201/1059* (2013.01); *H05K 2201/10159* (2013.01); *H05K 2201/10409* (2013.01); *H05K 2201/10606* (2013.01); *H05K 2201/2036* (2013.01); *H05K 2203/167* (2013.01)

(58) Field of Classification Search
USPC ...... 361/676–678, 679.46–679.54, 688–723;
165/80.1–80.5, 104.33, 185;
174/15.1–15.3, 16.1–16.3, 547, 548;
257/712–722, E23.088; 24/453, 458–459;
454/184; 312/236
See application file for complete search history.

(56) References Cited

U.S. PATENT DOCUMENTS

| | | | | |
|---|---|---|---|---|
| 5,770,891 | A * | 6/1998 | Frankeny | H05K 3/325 257/698 |
| 6,161,749 | A * | 12/2000 | Bastacky | B23K 3/087 228/212 |
| 6,349,032 | B1 * | 2/2002 | Chan | H01L 23/4093 257/718 |
| 6,449,155 | B1 * | 9/2002 | Colbert | H01L 23/4006 165/185 |
| 6,773,269 | B1 * | 8/2004 | Downes | H05K 3/368 439/55 |
| 7,196,907 | B2 * | 3/2007 | Zheng | H01R 13/2435 361/760 |
| 7,385,824 | B2 * | 6/2008 | Barsun | H05K 7/1092 257/707 |
| 7,476,963 | B2 * | 1/2009 | Garth | H01L 23/49838 257/686 |
| 8,248,801 | B2 * | 8/2012 | Campbell | H05K 7/20836 165/104.33 |
| 8,680,670 | B2 * | 3/2014 | Casey | H01L 23/4006 257/706 |
| 9,029,740 | B2 * | 5/2015 | Aguilar | B23K 1/012 219/482 |
| 9,153,460 | B2 * | 10/2015 | Colgan | H01L 24/92 |
| 9,408,327 | B2 * | 8/2016 | Albrecht, III | H05K 1/0203 |
| 2002/0031923 | A1 * | 3/2002 | Perino | H05K 7/1431 439/70 |
| 2006/0038287 | A1 | 2/2006 | Hamasaki et al. | |
| 2006/0084254 | A1 * | 4/2006 | Attarwala | H01L 21/4857 438/584 |
| 2008/0123297 | A1 * | 5/2008 | Tilton | H05K 7/20345 361/700 |
| 2009/0027859 | A1 * | 1/2009 | Giacoma | H01L 21/50 361/709 |
| 2010/0124827 | A1 * | 5/2010 | Blair | H05K 7/10 439/63 |
| 2011/0235283 | A1 | 9/2011 | Brown et al. | |
| 2011/0249404 | A1 * | 10/2011 | Chiu | G06F 1/20 361/704 |
| 2012/0098116 | A1 * | 4/2012 | Casey | H01L 23/4006 257/706 |
| 2012/0099280 | A1 * | 4/2012 | Lee | H05K 7/209 361/704 |
| 2014/0301042 | A1 * | 10/2014 | Stella | H05K 1/0204 361/709 |
| 2015/0043161 | A1 * | 2/2015 | Nelson | G06F 1/206 361/679.54 |
| 2015/0270617 | A1 * | 9/2015 | Fakharzadeh | H01Q 13/02 343/786 |
| 2016/0174413 | A1 * | 6/2016 | Steinbrecher | H05K 7/20727 361/679.51 |
| 2016/0351526 | A1 * | 12/2016 | Boyd | H05K 7/20 |
| 2017/0092619 | A1 * | 3/2017 | Refai-Ahmed | H01L 25/0655 |
| 2018/0007791 | A1 * | 1/2018 | Prakash | H01L 23/498 |
| 2018/0076541 | A1 * | 3/2018 | Matoy | H01R 12/585 |

OTHER PUBLICATIONS

Peng Su et al; Apparatus, System, and Method for Mitigating Warpage of Lidless Integrated Circuits During Reflow Processes; U.S. Appl. No. 15/671,083, filed Aug. 7, 2017.

* cited by examiner

APPARATUS, SYSTEM, AND METHOD FOR PRECISE HEATSINK ALIGNMENT ON CIRCUIT BOARDS

BACKGROUND

The power dissipation of electronic components within networking equipment (such as routers and/or switches) has increased significantly over the last several years. For example, the power dissipation of certain Application-Specific Integrated Circuits (ASICs) in network devices has recently increased to more than 200 W. The power dissipation of memory devices in network devices has also increased several fold. As a result of these increases in power dissipation, thermal management has become more critical and challenging. To ensure the long-term reliability and performance of the individual components and the overall devices, operation temperatures of the individual components must be regulated and/or maintained within a certain temperature range.

To maintain the operating temperatures of those components within that temperature range, one of the most common and effective solutions is to attach heatsinks to the components. These heatsinks absorb, conduct, and/or dissipate heat away from the components and thus limit their maximum operating temperatures. Such heatsinks may make physical contact with the individual components included on a circuit board by way of screws, spacers, and/or standoffs that mount to holes formed into the circuit board.

In the past, these traditional heatsink mounting techniques may have sufficed because the physical positioning needs of the heatsinks were less demanding, stringent, and/or precise. For example, even though variance existed in the dimensions of the mounting holes and screws, this variance usually had an insignificant effect on the heat-dissipation performance of the heatsinks. However, the effect of such variance may become more significant when multiple silicon dies are attached in close proximity to one another on the same component substrate.

As a specific example, a high-power ASIC die may be positioned next to a memory die on the same substrate. The high-power ASIC die and the memory die may have different maximum operating temperatures from one another. As a result, the high-power ASIC die and the memory die may need to be thermally isolated from one another by using two separate heatsinks. Since, in this example, the high-power ASIC die and the memory die need to be thermally isolated from one another, the precise alignment of the heatsinks relative to one another may be critical to the performance and/or reliability of the device.

Unfortunately, traditional heatsink mounting techniques may enable a heatsink mounted to an ASIC die to be misaligned enough to make physical contact with a neighboring heatsink mounted to one or more memory dice. By making such contact, the heatsink mounted to the ASIC die may no longer be thermally isolated from the heatsink mounted to the memory dice. Accordingly, the heatsinks may effectively form a thermal bridge that facilitates heat transfer from one side to another (e.g., from the hotter side to the cooler side), thereby threatening the performance and/or functionality of the memory dice.

The instant disclosure, therefore, identifies and addresses a need for additional and improved apparatuses, systems, and methods for precise heatsink alignment on circuit boards.

SUMMARY

As will be described in greater detail below, the instant disclosure generally relates to apparatuses, systems, and methods for precise heatsink alignment on circuit boards. In one example, an apparatus for accomplishing such a task may include (1) at least one alignment pin that (A) is placed proximate to a component on a circuit board and (B) is secured proximate to the component on the circuit board and (2) at least one heatsink that (A) is placed atop the component after completion of a reflow process in which the component is soldered to the circuit board, (B) is aligned by the alignment pin such that the heatsink resides in a specific position atop the component, and (C) absorbs heat dissipated by the component when the component is operational.

Similarly, a circuit board incorporating the above-described apparatus may include (1) at least one component, (2) at least one alignment pin that (A) is placed proximate to the component and (B) is secured proximate to the component, and (3) at least one heatsink that (A) is placed atop the component after completion of a reflow process in which the component is soldered to the circuit board, (B) is aligned by the alignment pin such that the heatsink resides in a specific position atop the component, and (C) absorbs heat dissipated by the component when the component is operational.

A corresponding method may include (1) placing at least one alignment pin atop at least one solder pad located proximate to a component on a circuit board, (2) securing the alignment pin proximate to the component on the circuit board, (3) placing at least one heatsink atop the component after completion of a reflow soldering process in which the component is soldered to the circuit board, and then (4) aligning the heatsink via the alignment pin such that the heatsink resides in a specific position atop the component.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
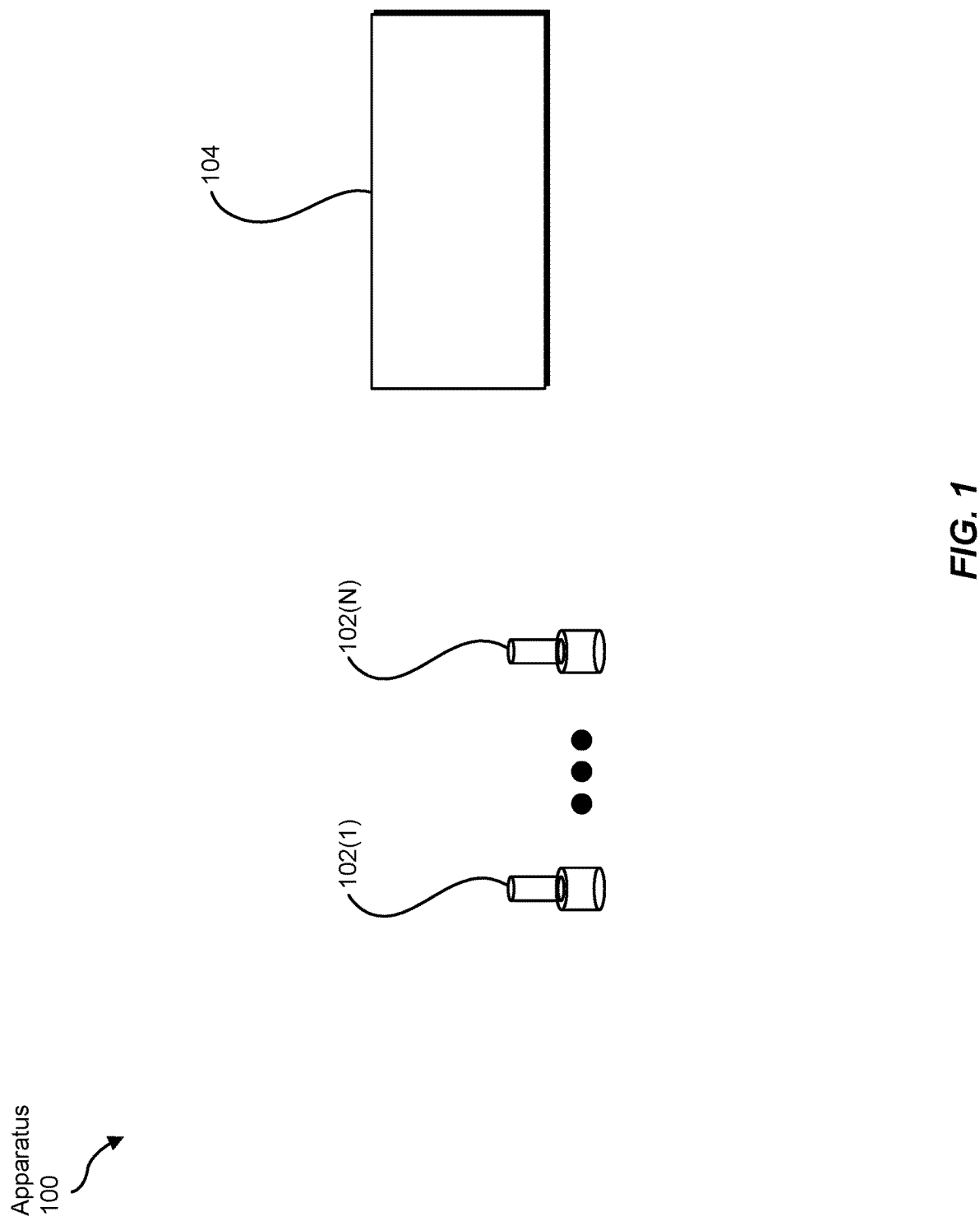
FIG. 1 is a block diagram of an exemplary apparatus for precise heatsink alignment on circuit boards.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for precise heatsink alignment on circuit boards. As will be explained in greater detail below, embodiments of the instant disclosure may involve placing and securing alignment pins near a component (e.g., a lidless integrated circuit) on a Printed Circuit Board (PCB). The alignment pins may be secured in place in a variety of different ways (such as soldering, press-fit connections, and/or screwing). As a specific example, solderable alignment pins may be placed on solder pads near a component on a PCB prior to a reflow soldering process. Subsequently, the reflow soldering process may solder the alignment pins in place near the component on the PCB. After completion of the reflow soldering process, a heatsink may be placed atop the component. The alignment pins may serve to align the heatsink in a specific position as it is placed atop the component.

By doing so, the alignment pins may effectively ensure that the heatsink does not come in physical contact with another nearby heatsink or another nearby component, thereby preventing the formation of a thermal bridge that causes unintentional heat transfer from one component to another. Moreover, by preventing the formation of such a thermal bridge, the alignment pins may facilitate greater temperature control over the respective components and/or mitigate or decrease the threat of performance impairment and/or component failure that could potentially result from the formation of a thermal bridge.

The following will provide, with reference to FIGS. 1-4, examples of apparatuses and/or corresponding components and implementations that facilitate precise heatsink alignment on circuit boards. In addition, the following will provide, with reference to FIG. 5, examples of methods for facilitating precise heatsink alignment on circuit boards.

FIG. 1 shows an exemplary apparatus 100 for precise heatsink alignment on circuit boards. As illustrated in FIG. 1, apparatus 100 may include and/or represent alignment pins 102(1)-(N) and a heatsink 104. The term "alignment pin," as used herein, generally refers to any type or form of physical material, structure, and/or support feature that holds and/or aligns a heatsink in a specific position when placed atop a component on a circuit board. In one example, alignment pins 102(1)-(N) may each include and/or represent a physical member and/or peg capable of supporting and/or maintaining heatsink 104 in place on a circuit board.

Alignment pins 102(1)-(N) may each include and/or form any suitable shape. In some examples, alignment pins 102(1)-(N) may form a square, a circle, an oval, a cube, a cylinder, portions of one or more of the same, and/or variations or combinations of one or more of the same. In one example, alignment pins 102(1)-(N) may each include an underside and/or base designed to be soldered to pads on a circuit board. In another example, alignment pins 102(1)-(N) may each include a press-fit connector and/or fastener that is designed to form a press-fit connection with or in a hole on a circuit board. In a further example, alignment pins 102(1)-(N) may each include a thread or threaded portion that is designed to mate with a threaded hole formed in the circuit board. Alignment pins 102(1)-(N) may each be of any suitable dimensions.

Alignment pins 102(1)-(N) may each include and/or contain any of a variety of materials. Examples of such materials include, without limitation, metals, plastics, ceramics, polymers, composites, combinations or variations of one or more of the same, and/or any other suitable materials. In addition, alignment pins 102(1)-(N) may each be of any suitable dimensions.

The term "heatsink," as used herein, generally refers to any type or form of system, device, structure, and/or mechanism that conducts, transfers, absorbs, and/or sinks heat. Heatsinks may include and/or contain a variety of materials. In one example, heatsink 104 may include and/or represent a finned and/or pin fin heatsink capable of being attached to and/or absorbing heat generated by a component soldered to a circuit board.

Heatsink 104 may include and/or form any suitable shape. In some examples, heatsink 104 may form a square, a rectangle, a circle, an oval, portions of one or more of the same, and/or variations or combinations of one or more of the same. Additionally or alternatively, heatsink 104 may each include a section that is designed to make physical contact with and/or facilitate heat transfer from a component soldered to a circuit board.

Heatsink 104 may each include and/or contain any of a variety of materials. Examples of such heatsink materials include, without limitation, copper, aluminum, copper, diamond, alloys of one or more of the same, combinations or variations of one or more of the same, and/or any other suitable materials. In addition, heatsink 104 may each be of any suitable dimensions.

Figure 2:
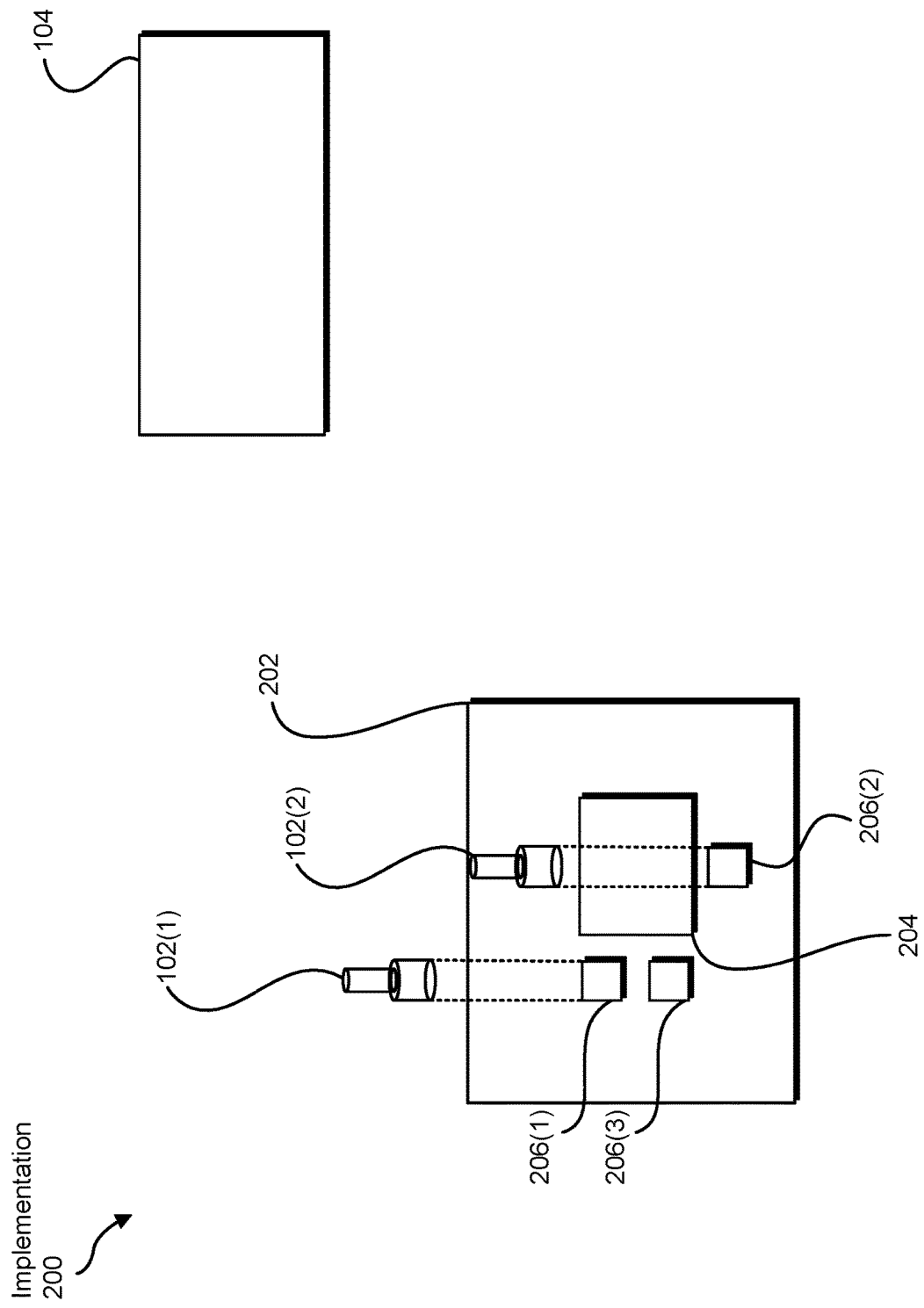
FIG. 2 is a block diagram of an exemplary implementation of an apparatus for precise heatsink alignment on circuit boards.

FIG. 2 shows an exemplary implementation 200 of apparatus 100 in FIG. 1. As illustrated in FIG. 2, implementation 200 may include and/or involve alignment pins 102(1) and 102(2) as well as heatsink 104. In addition, implementation 200 may include and/or involve a circuit board 202 and a component 204. In this example, component 204 may be placed atop one or more corresponding solder pads on circuit board 202 in preparation for a reflow soldering process.

Examples of component 204 include, without limitation, ASICs, integrated circuits, lidless integrated circuits, microprocessors, microcontrollers, Central Processing Units (CPUs), Field-Programmable Gate Arrays (FPGAs), memory devices, High Bandwidth Memory (HBM), Random Access Memory (RAM), Read Only Memory (ROM), flash memory, caches, portions of one or more of the same, variations or combinations of one or more of the same, and/or any other suitable component.

As illustrated in FIG. 2, circuit board 202 may include and/or form solder pads 206(1), 206(2), and 206(3). In this example, solder pads 206(1) and 206(2) may be designed to hold and/or secure alignment pins 102(1) and 102(2), respectively, to circuit board 202 by way of reflow soldering. Similarly, solder pad 206(3) may be designed to hold and/or secure another alignment pin (not illustrated in FIG. 2) to circuit board 202 by way of reflow soldering. Solder pads 206(1)-(3), and thus alignment pins 102(1) and 102(2), may be strategically positioned in certain places on circuit board 202 to provide support to and/or facilitate the alignment of heatsink 104 atop component 204 after completion of the reflow soldering process.

By doing so, alignment pins 102(1) and 102(2) (along with any other alignment pins not illustrated in FIG. 2) may effectively ensure that heatsink 104 does not come in physical contact with any other nearby heatsink or any other nearby component, thereby preventing the formation of a thermal bridge that causes unintentional heat transfer from one component to another. Moreover, by preventing the formation of such a thermal bridge, alignment pins 102(1) and 102(2) (along with any other alignment pins not illustrated in FIG. 2) may facilitate greater temperature control over component 204 and/or certain neighboring components. Accordingly, alignment pins 102(1) and 102(2) (along with any other alignment pins not illustrated in FIG. 2) may mitigate or decrease the threat of performance impairment and/or component failure that could potentially result from the formation of a thermal bridge involving heatsink 104.

In some examples, alignment pins 102(1) and 102(2) may be placed proximate to component 204 prior to a reflow process in which component 204 is soldered to circuit board 202. Alignment pins 102(1) and 102(2) may be placed in their corresponding positions in a variety of ways. For example, a pick-and-place machine may place and/or position alignment pins 102(1) and 102(2) atop solder pads 206(1) and 206(2), respectively, in preparation for a reflow process. Alternatively, a human technician may place and/or position alignment pins 102(1) and 102(2) atop solder pads 206(1) and 206(2), respectively, in preparation for a reflow process.

Either way, the reflow process may effectively solder component 204 to its corresponding solder pads and also solder alignment pins 102(1) and 102(2) to solder pads 206(1) and 206(2), respectively. By soldering alignment pins 102(1) and 102(2) to solder pads 206(1) and 206(2) in this way, the reflow process may secure alignment pins 102(1) and 102(2) proximate to component 204 on circuit board 202. In this example, alignment pins 102(1) and 102(2) may be oriented perpendicular to circuit board 202. In other words, when circuit board 202 is oriented in a horizontal position, alignment pins 102(1) and 102(2) may rise vertically from circuit board 202.

In some examples, heatsink 104 may be placed atop component 204 after completion of the reflow process. Heatsink 104 may be placed atop component 204 in a variety of ways. For example, an automated robotic system may place and/or position heatsink 104 atop component 204 after the reflow process has soldered alignment pins 102(1) and 102(2) and component 204. Alternatively, a human technician may place and/or position heatsink 104 atop component 204 after the reflow process has soldered alignment pins 102(1) and 102(2) and component 204.

Either way, alignment pins 102(1) and 102(2) (along with any other alignment pins not illustrated in FIG. 2) may effectively align heatsink 104 such that heatsink 104 resides in a specific position atop component 204. For example, alignment pins 102(1) and 102(2) may serve to align heatsink 104 in a specific position as heatsink 104 is placed atop component 204. In one example, alignment pins 102(1) and 102(2) may be designed to align heatsink 104 in a specific position relative to another component (not illustrated in FIG. 2) located proximate to component 204 on circuit board 202. In another example, alignment pins 102(1) and 102(2) may be designed to align heatsink 104 in a specific position relative to another heatsink (not illustrated in FIG. 2) placed atop a neighboring component on circuit board 202.

In some examples, heatsink 104 may absorb and/or sink heat generated and/or dissipated by component 204 when component 204 is operational. For example, when component 204 is operating and/or running as part of circuit board 202, component 204 may generate and/or dissipate heat. Since, in this example, heatsink 104 is placed atop component 204, heatsink 104 may absorb and/or sink the heat generated and/or dissipated by component 204.

Although implementation 200 in FIG. 2 demonstrates how alignment pins 102(1) and 102(2) may be soldered to circuit board 202 via surface-mount solder pads, alignment pins 102(1) and 102(2) may alternatively be soldered to circuit board in various other ways. For example, alignment pins 102(1) and 102(2) may each include a tail that is soldered to a plated through-hole on circuit board 202. In one example, the tails of alignment pins 102(1) and 102(2) may be inserted in plated through-holes on circuit board 202 near component 204. After these tails have been inserted in this way, circuit board 202 may undergo a wave soldering process in which molten solder enters the plated through-holes from the bottom surface of circuit board 202. Once cooled, the solder that entered the plated through-holes may hold alignment pins 102(1) and 102(2) in place by the tails. In this example, the wave soldering process may take place before or after the reflow soldering process in which component 204 is soldered to circuit board 202.

In another example, solder paste may be printed and/or inserted into the plated through-holes on circuit board 202. Following the soldering paste, alignment pins 102(1) and 102(2) may be placed and/or inserted into the plated through-holes on circuit board 202. In this example, circuit board 202 may undergo a reflow soldering process in which component 204 and alignment pins 102(1) and 102(2) are all soldered to their corresponding positions at the same time, thereby eliminating any need to perform multiple reflow soldering processes on circuit board 202.

Although implementation 200 in FIG. 2 demonstrates how alignment pins 102(1) and 102(2) may be secured to circuit board 202 by way of soldering, alignment pins 102(1) and 102(2) may alternatively be secured to the circuit board in a number of other ways. For example, alignment pins 102(1) and 102(2) may each include a press-fit connector and/or fastener (rather than a solderable base). In this example, alignment pins 102(1) and 102(2) may be inserted into holes formed in circuit board 202. Accordingly, alignment pins 102(1) and 102(2) may be secured to circuit board 202 by way of a press-fit connection.

In another example, alignment pins 102(1) and 102(2) may each include a thread or threaded base (rather than a solderable base). In this example, alignment pins 102(1) and 102(2) may be inserted into threaded holes formed in circuit board 202. Accordingly, alignment pins 102(1) and 102(2) may be secured to circuit board 202 by screwing the threads into the threaded holes formed in circuit board 202.

Figure 3:
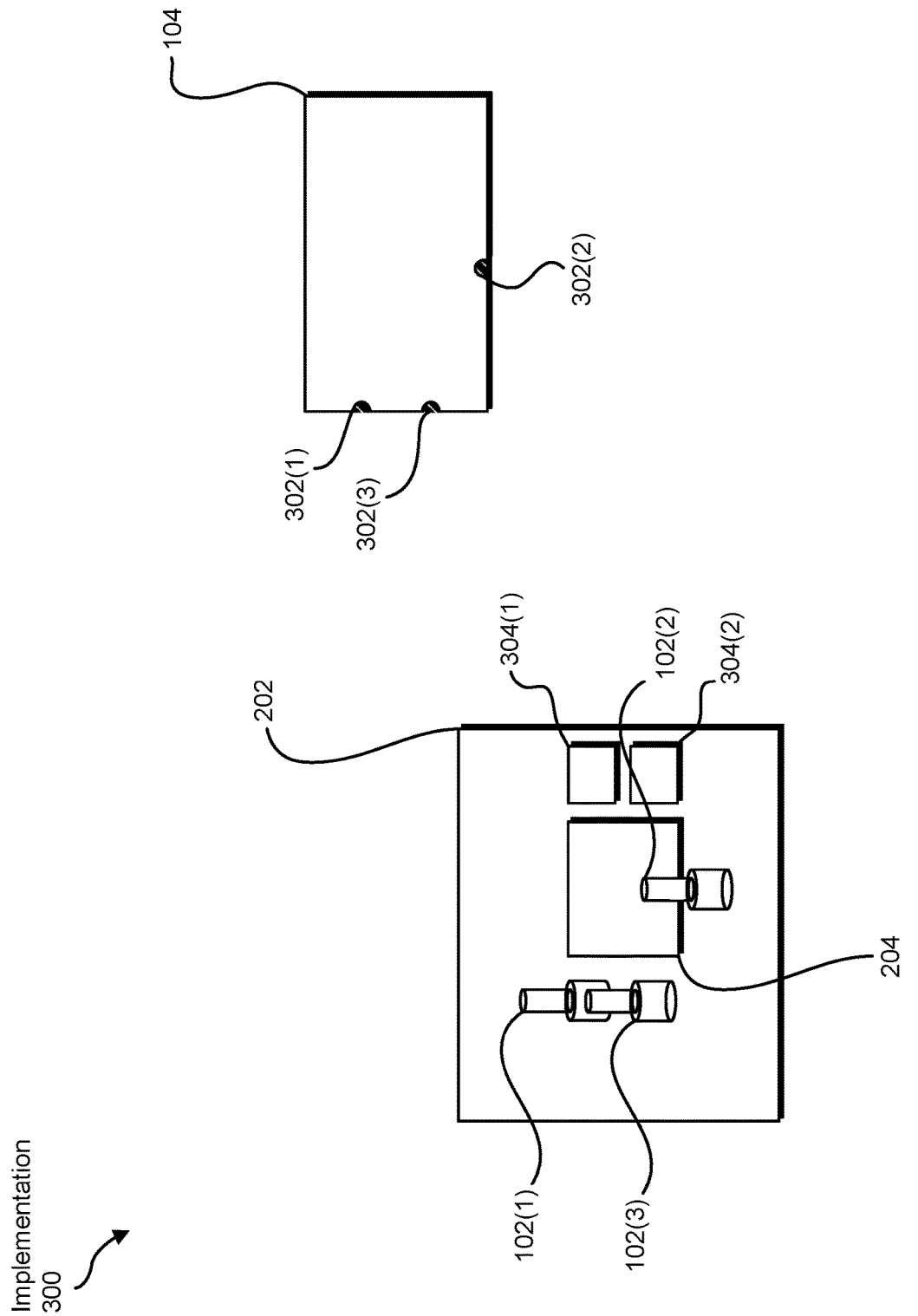
FIG. 3 is a block diagram of an additional exemplary implementation of an apparatus for precise heatsink alignment on circuit boards.

FIG. 3 shows an exemplary implementation 300 of apparatus 100 in FIG. 1. As illustrated in FIG. 3, implementation 300 may include and/or involve alignment pins 102(1)-102(3), which are placed proximate to component 204 and secured to circuit board 202. In addition, implementation 300 may include and/or involve heatsink 104 that is placed atop component 204 on circuit board 202. Implementation 300 may also include and/or involve components 304(1) and 304(2) that are located proximate to component 204 and secured to circuit board 202.

Examples of component 304(1) and 304(2) include, without limitation, ASICs, integrated circuits, lidless integrated circuits, microprocessors, microcontrollers, CPUs, FPGAs, memory devices, HBM, RAM, ROM, flash memory, caches, portions of one or more of the same, variations or combinations of one or more of the same, and/or any other suitable component.

As illustrated in FIG. 3, heatsink 104 may include and/or form notches 302(1), 302(2), and 302(3). The term "notch,"

as used herein, generally refers to any type or form of indentation, groove, cut, slit, and/or nick included in and/or formed by a heatsink. In one example, notches 302(1)-(3) may receive, accept, and/or fit alignment pins 102(1)-(3), respectively. For example, when heatsink 104 is placed atop component 204, notches 302(1)-(3) on heatsink 104 may receive alignment pins 102(1)-(3), respectively, which effectively facilitate aligning heatsink 104 in a specific position atop component 204.

Notches 302(1)-(3) may include and/or form any suitable shape. In one example, notches 302(1)-(3) may each be formed in the shape of a semi-circle. In another example, notches 302(1)-(3) may each be formed in the shape of a semi-oval. In any case, notches 302(1)-(3) may be formed in a shape that matches and/or corresponds to the shape of alignment pins 102(1)-(3).

In some examples, heatsink 104 may be locked into the specific position atop component 204 by one or more mounting screws secured to circuit board 202. For example, an automated robotic system may tighten one or more mounting screws into corresponding holes formed in circuit board 202 to lock heatsink 104 in place. Alternatively, a human technician may tighten one or more mounting screws into corresponding holes formed in circuit board 202 to lock heatsink 104 in place. In such examples, alignment pins 104 may align heatsink 104 in the proper position before the mounting screws permanently lock heatsink 104 in place.

As illustrated in FIG. 3, alignment pins 102(1)-(3) may be placed and/or positioned along multiple sides of component 204. By being placed and/or positioned along multiple sides of component 204, alignment pins 102(1)-(3) may provide greater control over and/or support of heatsink 104, thereby facilitating the proper and/or intended alignment of heatsink 104 on circuit board 202.

In some examples, embodiments of the instant disclosure may include multiple alignment pins that align multiple heatsinks relative to one another on a circuit board. For example, although not illustrated in this way in FIG. 3, implementation 300 may include and/or involve additional alignment pins (other than alignment pins 102(1)-(3)) that are secured proximate to components 304(1) and 304(2) on circuit board 202. In this example, implementation 300 may also include and/or involve an additional heatsink (other than heatsink 104) that is placed atop one or both of components 304(1) and 304(2) after completion of the reflow process. The additional heatsink may be aligned by the additional alignment pins such that the additional heatsink resides in a specific position atop one or both of components 304(1) and 304(2).

The additional heatsink may absorb and/or sink heat generated and/or dissipated by one or both of components 304(1) and 304(2) when operational. In one example, heatsink 104 and the additional heatsink may be thermally isolated from one another. Moreover, heatsink 104 and the additional heatsink may be aligned relative to one another by alignment pins 102(1)-(3) and the additional alignment pins. In doing so, alignment pins 102(1)-(3) and the additional alignment pins may prevent thermal contact between heatsink 104 and the additional heatsink.

In one example, component 204 may include and/or represent an ASIC. In this example, components 304(1) and 304(2) may each include and/or represent a memory device (e.g., an HBM device).

Figure 4:
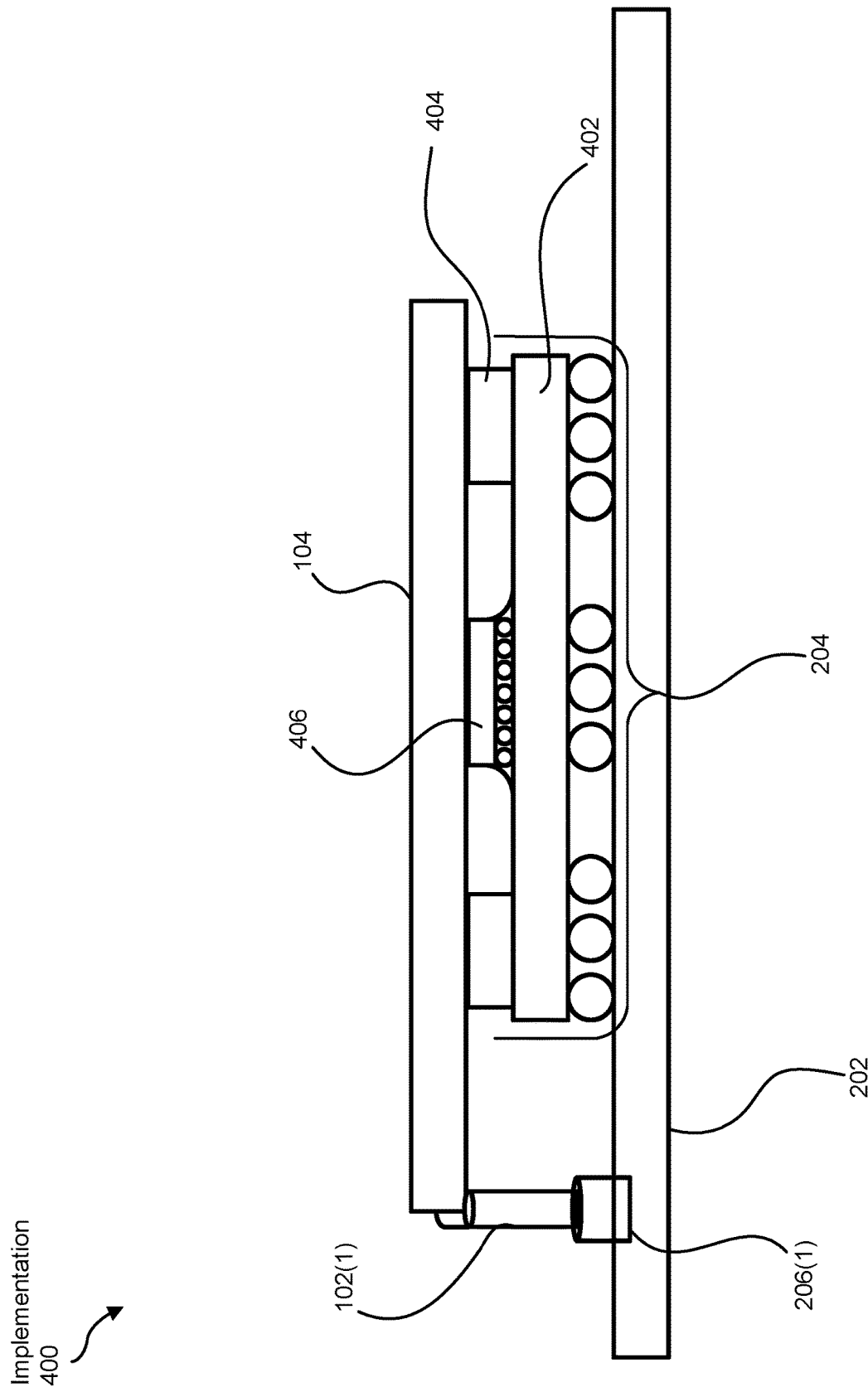
FIG. 4 is a block diagram of a further exemplary implementation of an apparatus for precise heatsink alignment on circuit boards.

FIG. 4 shows an exemplary implementation 400 of apparatus 100 in FIG. 1. As illustrated in FIG. 4, implementation 400 may include and/or involve alignment pin 102(1), which is placed proximate to component 204 and secured to circuit board 202 at solder pad 206(1). In addition, implementation 400 may include and/or involve heatsink 104 that is placed atop component 204 on circuit board 202.

As illustrated in FIG. 4, heatsink 104 may interface with, reside on, and/or sit atop component 204. In this example, component 204 may include a substrate 402 and a die 406. In this example, die 406 may be set on and/or attached or coupled to substrate 402.

In one example, substrate 402 may include and/or represent a wafer of semiconductor materials (such as silicon, germanium, and/or gallium arsenide). In another example, substrate 402 may include and/or represent a wafer of electrical insulator materials (such as silicon dioxide, sapphire, aluminum oxide, polymers, and/or ceramics). Substrate 402 may include multiple layers of insulation materials. Substrate 402 may also include copper traces and/or through-silicon vias that route the signals from the silicon to the connection terminals and/or leads on the bottom of the package of component 204.

In one example, die 406 may include and/or represent a small, diced piece of semiconductor material. In this example, die 406 may include and/or contain one or more circuits that consist of various electrical and/or electronic components (such as resistors, capacitors, and/or transistors). For example, these circuits may be etched into die 406.

Although illustrated as a single unit in FIG. 4, die 406 may alternatively include and/or represent multiple die attached to substrate 402. In one example, the multiple die may be stacked together (using, e.g., a "through-silicon vias" technique) and then attached to substrate 402 as a stack. In a further example, a silicon interposer may be attached to substrate 402 first, after which die 406 and/or other components may be attached to the silicon interposer (in, e.g., a "2.5 D" package).

As illustrated in FIG. 4, component 204 may also include support brace 404. For example, support brace 404 may be fastened, attached, and/or coupled to substrate 402. In this example, support brace 404 may serve as a connection point and/or guide that holds and/or supports heatsink 104 in place over the top surface of substrate 402.

Figure 5:
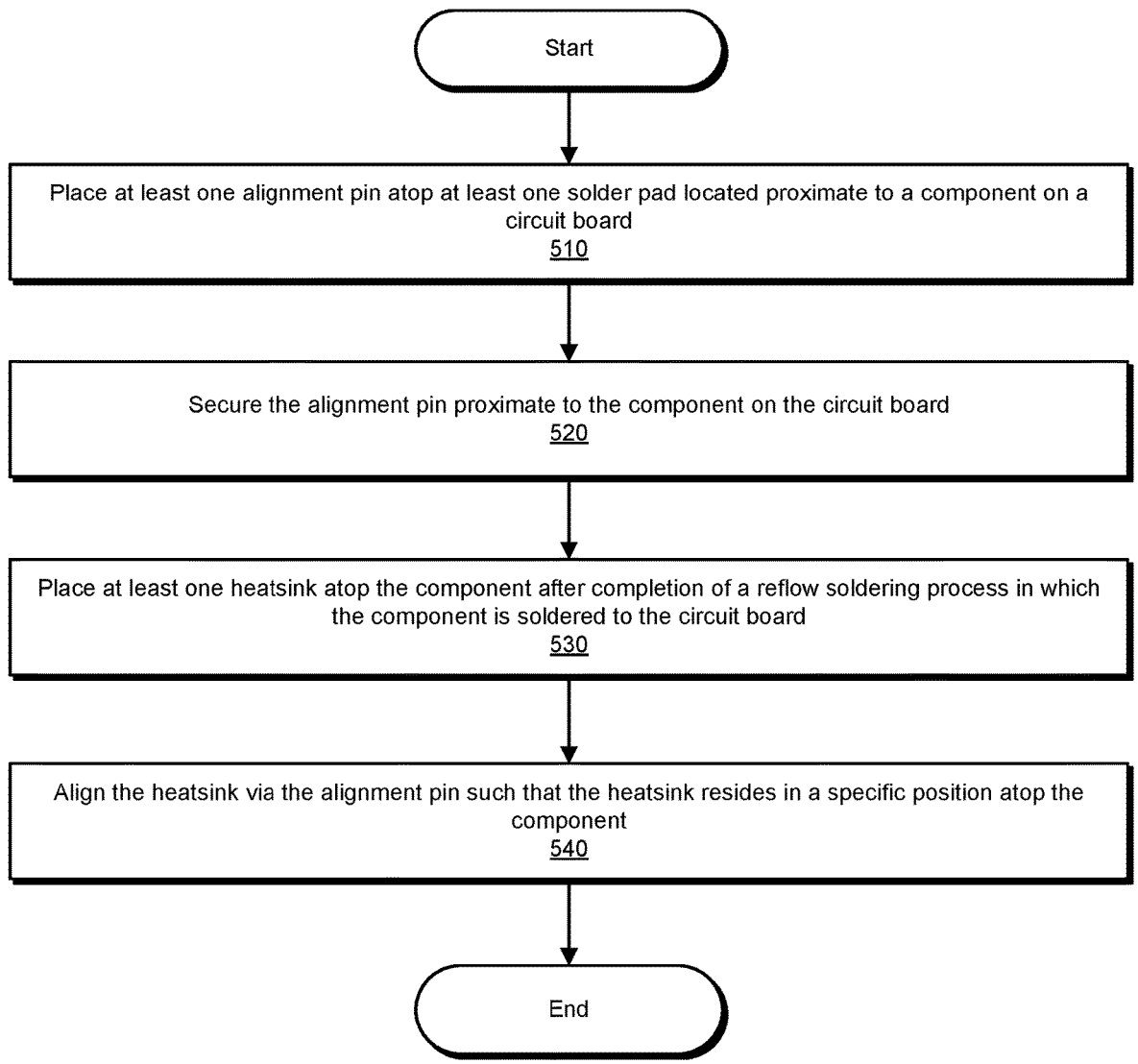
FIG. 5 is a flow diagram of an exemplary method for precise heatsink alignment on circuit boards.

FIG. 5 is a flow diagram of an exemplary method 500 for precise heatsink alignment on circuit boards. As illustrated in FIG. 5, method 500 may include the step of placing at least one alignment pin atop at least one solder pad located proximate to a component on a circuit board (510). This placing step may be performed in a variety of ways and/or contexts. For example, a pick-and-place machine may place and/or position alignment pins atop solder pads on a circuit board in preparation for a reflow process. Alternatively, a human technician may place and/or position alignment pins atop solder pads on a circuit board in preparation for a reflow process.

In other examples, an automated system may place and/or position alignment pins in holes formed in a circuit board. Alternatively, a human technician may place and/or position alignment pins in holes formed in a circuit board. In any case, upon placement, the alignment pins may be located proximate to a component on the circuit board.

Returning to FIG. 5, method 500 may also include the step of securing the alignment pin proximate to the component on the circuit board (520). This securing step may be performed in a variety of ways and/or contexts. For example, a reflow oven may perform and/or execute a reflow soldering process on the circuit board on which the alignment pins have been placed. In this example, the reflow soldering process may solder the alignment pins to the solder pads, thereby securing the alignment pins proximate to the component.

In other examples, an automated system or a human technician may secure the alignment pins proximate to the component on the circuit board by way of press-fit connections. Alternatively, an automated system or a human technician may secure the alignment pins proximate to the component on the circuit board by screwing them into threaded holes formed in the circuit board.

Returning to FIG. 5, method 500 may further include the step of placing at least one heatsink atop the component after completion of a reflow soldering process in which the component is soldered to the circuit board (530). This placing step may be performed in a variety of ways and/or contexts. For example, an automated system may place and/or position at least one heatsink atop the component after completion of the reflow process. Alternatively, a human technician may place and/or position at least one heatsink atop the component after completion of the reflow process.

Returning to FIG. 5, method 500 may further include the step of aligning the heatsink via the alignment pin such that the heatsink resides in a specific position atop the component (540). This aligning step may be performed in a variety of ways and/or contexts. For example, the alignment pins may serve to align the heatsink in a specific position as it is placed atop the component. By doing so, the alignment pins may effectively ensure that the heatsink does not come in physical contact with another nearby heatsink or another nearby component, thereby preventing the formation of a thermal bridge that causes unintentional heat transfer from one component to another. Moreover, by preventing the formation of such a thermal bridge, the alignment pins may facilitate greater temperature control over the respective components and/or mitigate or decrease the threat of performance impairment and/or component failure that could potentially result from the formation of a thermal bridge.

While the foregoing disclosure sets forth various embodiments using specific illustrations, flowcharts, and examples, each illustration component, flowchart step, operation, and/or component described and/or exemplified herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

Figure 6:
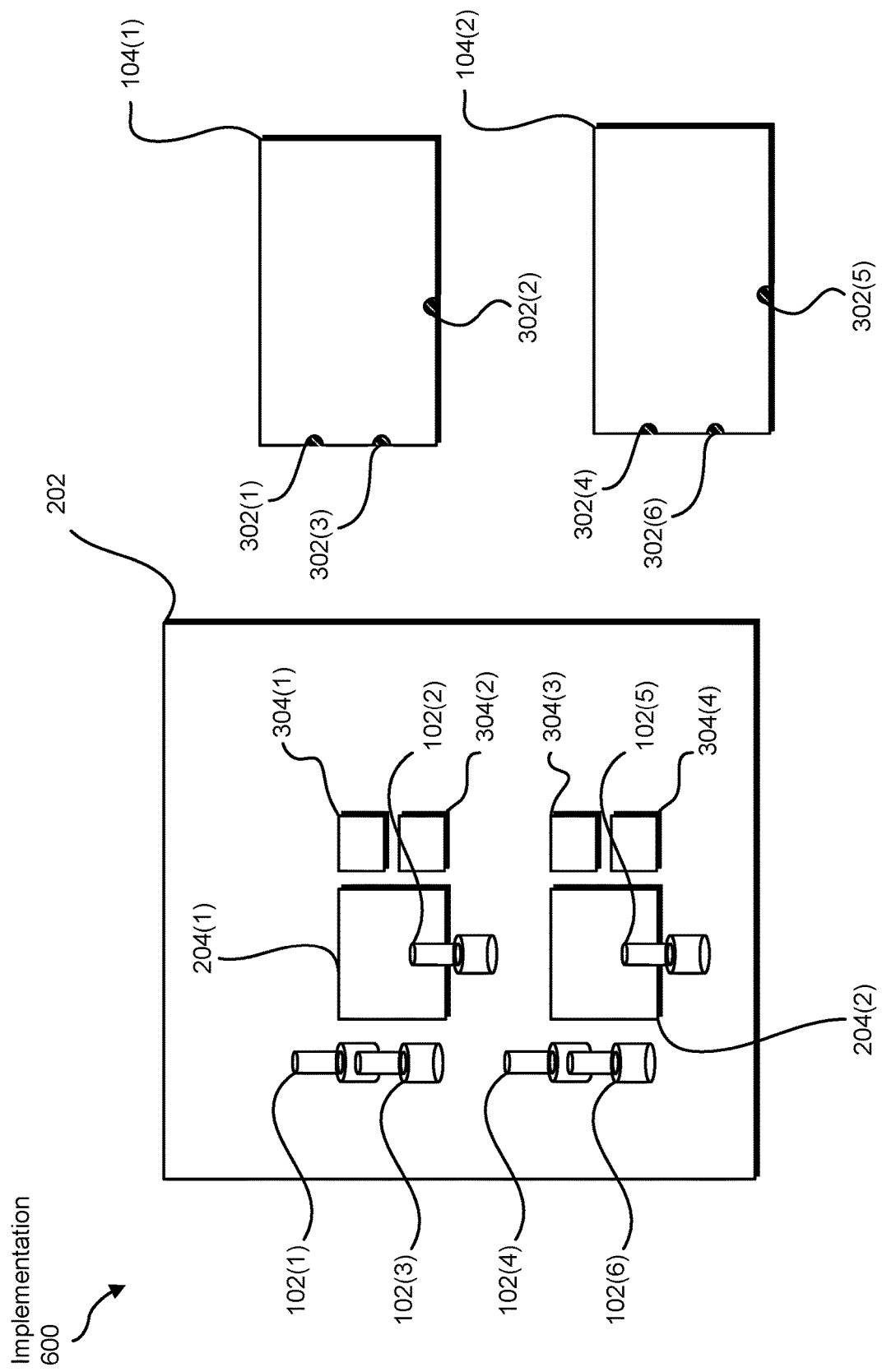
FIG. 6 is a block diagram of another exemplary implementation of an apparatus for precise heatsink alignment on circuit boards.

FIG. 6 shows an exemplary implementation 600 of two instances of apparatus 100 in FIG. 1. As illustrated in FIG. 6, implementation 600 may include and/or involve alignment pins 102(1)-102(3), which are placed proximate to component 204(1) and secured to circuit board 202. In addition, implementation 600 may include and/or involve heatsink 104(1) that is placed atop component 204(1) on circuit board 202. Implementation 600 may also include and/or involve components 304(1) and 304(2) that are located proximate to component 204(1) and secured to circuit board 202.

As illustrated in FIG. 6, heatsink 104(1) may include and/or form notches 302(1), 302(2), and 302(3). In one example, notches 302(1)-(3) may receive, accept, and/or fit alignment pins 102(1)-(3), respectively. For example, when heatsink 104(1) is placed atop component 204(1), notches 302(1)-(3) on heatsink 104 may receive alignment pins 102(1)-(3), respectively, which effectively facilitate aligning heatsink 104(1) in a specific position atop component 204(1). In some examples, heatsink 104(1) may be locked into the specific position atop component 204(1) by one or more mounting screws secured to circuit board 202.

As further illustrated in FIG. 6, implementation 600 may include and/or involve alignment pins 102(4)-102(6), which are placed proximate to component 204(2) and secured to circuit board 202. In addition, implementation 600 may include and/or involve heatsink 104(2) that is placed atop component 204(2) on circuit board 202. Implementation 600 may also include and/or involve components 304(3) and 304(4) that are located proximate to component 204(2) and secured to circuit board 202.

As illustrated in FIG. 6, heatsink 104(2) may include and/or form notches 302(4), 302(5), and 302(6). In one example, notches 302(4)-(6) may receive, accept, and/or fit alignment pins 102(4)-(6), respectively. For example, when heatsink 104(2) is placed atop component 204(2), notches 302(4)-(6) on heatsink 104(2) may receive alignment pins 102(1)-(3), respectively, which effectively facilitate aligning heatsink 104(2) in a specific position atop component 204(2). In some examples, heatsink 104(2) may be locked into the specific position atop component 204(2) by one or more mounting screws secured to circuit board 202.

What is claimed is:
1. An apparatus comprising:
  an alignment pin that is secured proximate to a component on a circuit board;
  a heatsink that:
    is placed atop the component after completion of a reflow process in which the component is soldered to the circuit board;
    is held by the alignment pin such that the heatsink resides in a specific position atop the component;

includes a notch that receives the alignment pin and facilitates aligning the heatsink in the specific position atop the component; and absorbs heat dissipated by the component when the component is operational;

an additional alignment pin that is secured proximate to an additional component on the circuit board; and an additional heatsink that:

is placed atop the additional component after completion of the reflow process;

is held by the additional alignment pin such that the additional heatsink resides in a specific position atop the additional component;

includes an additional notch that receives the additional alignment pin and facilitates aligning the additional heatsink in the specific position atop the additional component; and absorbs heat dissipated by the additional component when the component is operational;

wherein the heatsink and the additional heatsink are:

thermally isolated from one another; and aligned relative to one another by the alignment pin and the additional alignment pin to prevent thermal contact between the heatsink and the additional heatsink.

2. The apparatus of claim 1, wherein the alignment pin:
is placed atop a solder pad on the circuit board prior to the reflow process; and
is secured to the circuit board by soldering the alignment pin to the solder pad during the reflow process.

3. The apparatus of claim 1, wherein the alignment pin:
is inserted into a hole formed in the circuit board; and
is secured to the circuit board by way of a press-fit connection.

4. The apparatus of claim 1, wherein the alignment pin:
includes a thread that is designed to mate with a threaded hole formed in the circuit board; and
is secured to the circuit board by screwing the alignment pin into the threaded hole formed in the circuit board.

5. The apparatus of claim 1, wherein the notch is formed in a shape of at least one of:
a semi-circle; or
a semi-oval.

6. The apparatus of claim 1, wherein the heatsink is locked into the specific position atop the component by at least one mounting screw that is secured to the circuit board.

7. The apparatus of claim 1, wherein the alignment pin is oriented perpendicular to the circuit board.

8. The apparatus of claim 1, the alignment pin comprises a plurality of alignment pins that are placed along a plurality of sides of the component.

9. The apparatus of claim 1, wherein:
the component comprises an Application-Specific Integrated Circuit (ASIC); and
the additional component comprises at least one memory device.

10. A circuit board comprising:
a component;
an alignment pin that is secured proximate to the component;
a heatsink that:
is placed atop the component after completion of a reflow process in which the component is soldered to the circuit board;
is held by the alignment pin such that the heatsink resides in a specific position atop the component;

includes a notch that receives the alignment pin and facilitates aligning the heatsink in the specific position atop the component; and absorbs heat dissipated by the component when the component is operational;

an additional alignment pin that is secured proximate to an additional component on the circuit board; and an additional heatsink that:

is placed atop the additional component after completion of the reflow process;

is held by the additional alignment pin such that the additional heatsink resides in a specific position atop the additional component;

includes an additional notch that receives the additional alignment pin and facilitates aligning the additional heatsink in the specific position atop the additional component; and absorbs heat dissipated by the additional component when the component is operational;

wherein the heatsink and the additional heatsink are:

thermally isolated from one another; and aligned relative to one another by the alignment pin and the additional alignment pin to prevent thermal contact between the heatsink and the additional heatsink.

11. The circuit board of claim 10, wherein the alignment pin:
is placed atop a solder pad on the circuit board prior to the reflow process; and
is soldered to the solder pad during the reflow process.

12. The circuit board of claim 10, wherein the alignment pin:
is inserted into a hole formed in the circuit board; and
is secured to the circuit board by way of a press-fit connection.

13. The circuit board of claim 10, wherein the alignment pin:
includes a thread that is designed to mate with a threaded hole formed in the circuit board; and
is secured to the circuit board by screwing the alignment pin into the threaded hole formed in the circuit board.

14. The circuit board of claim 10, wherein the notch is formed in a shape of at least one of:
a semi-circle; or
a semi-oval.

15. The circuit board of claim 10, wherein the heatsink is locked into the specific position atop the component by at least one mounting screw that is secured to the circuit board.

16. A method comprising:
securing an alignment pin atop a solder pad located proximate to a component on a circuit board;
placing a heatsink atop the component after completion of a reflow soldering process in which the component is soldered to the circuit board, wherein the heatsink includes a notch that receives the alignment pin and facilitates aligning the heatsink in a specific position atop the component; and
holding the heatsink with the alignment pin via the notch such that the heatsink resides in the specific position atop the component;
securing an additional alignment pin atop an additional solder pad located proximate to an additional component on the circuit board;
placing an additional heatsink atop the additional component after completion of the reflow soldering process in which the additional component is soldered to the circuit board, wherein the additional heatsink includes an additional notch that receives the additional alignment pin and facilitates aligning the additional heatsink in a specific position atop the additional component; and holding the additional heatsink with the additional alignment pin via the additional notch such that the additional heatsink resides in the specific position atop the additional component and is thermally isolated from the heatsink.

* * * * *